(12) United States Patent
Rodriquez et al.

(10) Patent No.: US 9,929,215 B2
(45) Date of Patent: Mar. 27, 2018

(54) METHOD OF OPTIMIZING AN INTERFACE FOR PROCESSING OF AN ORGANIC SEMICONDUCTOR

(71) Applicant: DPIX, LLC, Colorado Springs, CO (US)

(72) Inventors: Robert Rodriquez, Colorado Springs, CO (US); Shawn Michael O'Rourke, Colorado Springs, CO (US); Michael Robert Johnson, Colorado Springs, CO (US); Sanjeev Tandon, Colorado Springs, CO (US)

(73) Assignee: DPIX, LLC, Colorado Springs, CO (US)

( * ) Notice: Subject to any disclaimer, the term of this patent is extended or adjusted under 35 U.S.C. 154(b) by 0 days.

(21) Appl. No.: 15/494,226

(22) Filed: Apr. 21, 2017

(65) Prior Publication Data

US 2018/0019284 A1    Jan. 18, 2018

Related U.S. Application Data

(60) Provisional application No. 62/361,341, filed on Jul. 12, 2016.

(51) Int. Cl.
*H01L 21/00* (2006.01)
*H01L 27/30* (2006.01)
*H01L 51/44* (2006.01)
*H01L 51/00* (2006.01)

(52) U.S. Cl.
CPC ........ *H01L 27/307* (2013.01); *H01L 51/0018* (2013.01); *H01L 51/44* (2013.01)

(58) Field of Classification Search
CPC .... H01L 27/307; H01L 51/44; H01L 51/0018
See application file for complete search history.

(56) References Cited

U.S. PATENT DOCUMENTS

| 7,189,992 B2 | 3/2007 | Wager, III et al. |
| 7,230,271 B2 | 6/2007 | Yamazaki et al. |
| 7,382,421 B2 | 6/2008 | Hoffman et al. |
| 8,021,204 B2 | 9/2011 | Yamazaki et al. |
| 8,098,351 B2 | 1/2012 | Kar-Roy |

(Continued)

FOREIGN PATENT DOCUMENTS

| CN | 102916085 A | 2/2013 |
| WO | 0133634 A1 | 5/2001 |
| WO | 2011099336 A1 | 8/2011 |

OTHER PUBLICATIONS

Chuang, Chiao-Shun et al. "P-13: Photosensitivity of Amorphous IGZO TFTs for Active-Matrix Flat-Panel Displays", SID 08 Digest, pp. 1215-1218.

(Continued)

*Primary Examiner* — Richard Booth
(74) *Attorney, Agent, or Firm* — Slater Matsil, LLP

(57) ABSTRACT

A method of forming an organic semiconductor includes forming a thin film transistor ("TFT") backplane; forming a pixel well over the TFT backplane using a photoresist; performing a first plasma etch of the pixel well; stripping the photoresist in the pixel well; performing a second plasma etch of the pixel well; performing a first wash of the pixel well; exposing the pixel well to ultraviolet light; performing a second wash of the pixel well; and forming an organic photodiode in the pixel well.

20 Claims, 12 Drawing Sheets

(56) References Cited

U.S. PATENT DOCUMENTS

| | | | |
|---|---|---|---|
| 8,558,453 B2 | 10/2013 | Sakakura et al. | |
| 8,610,232 B2 | 12/2013 | Coe-Sullivan et al. | |
| 8,956,907 B2 | 2/2015 | Ono et al. | |
| 8,987,724 B2 | 3/2015 | Benwadih | |
| 9,009,637 B2 | 4/2015 | Premont et al. | |
| 9,178,102 B2 | 11/2015 | Fujita et al. | |
| 9,269,737 B1 | 2/2016 | O'Rourke et al. | |
| 9,484,537 B2 | 11/2016 | Liang et al. | |
| 2005/0277208 A1 | 12/2005 | Nakazawa et al. | |
| 2006/0261342 A1 | 11/2006 | Wells | |
| 2007/0104891 A1 | 5/2007 | Fournand | |
| 2008/0054386 A1* | 3/2008 | Akram | H01L 27/14621 257/432 |
| 2008/0237474 A1 | 10/2008 | Tonotani et al. | |
| 2009/0032815 A1* | 2/2009 | Arthur | G02F 1/133305 257/52 |
| 2010/0044711 A1 | 2/2010 | Imai | |
| 2010/0320391 A1 | 12/2010 | Antonuk | |
| 2012/0025189 A1 | 2/2012 | Jeon et al. | |
| 2012/0033161 A1 | 2/2012 | Han et al. | |
| 2012/0061578 A1 | 3/2012 | Lim et al. | |
| 2012/0248452 A1 | 10/2012 | Yeo et al. | |
| 2012/0268427 A1 | 10/2012 | Slobodin | |
| 2012/0300147 A1 | 11/2012 | Shieh et al. | |
| 2013/0075719 A1 | 3/2013 | Nakano et al. | |
| 2013/0107153 A1 | 5/2013 | Qin | |
| 2013/0140568 A1 | 6/2013 | Miyamoto et al. | |
| 2013/0161626 A1 | 6/2013 | Jo et al. | |
| 2013/0187161 A1 | 7/2013 | Yamazaki | |
| 2013/0229590 A1 | 9/2013 | Kim | |
| 2013/0313545 A1 | 11/2013 | Saito et al. | |
| 2014/0197412 A1 | 7/2014 | Nishimura et al. | |
| 2016/0013243 A1 | 1/2016 | O'Rourke et al. | |
| 2016/0225612 A1* | 8/2016 | Lu | H01J 37/3177 |

OTHER PUBLICATIONS

Extended European Search Report for Application No. 15158510.6, dated Sep. 21, 2015, 6 pages.

Liu, Xilan et al., "Solution-processed near-infrared polymer photodetectors with an inverted device structure", Organic Electronics 13 (2012), pp. 2929-2934.

Gelinck, Gerwin H. et al., "X-ray imager using solution processed organic transistor arrays and bulk heterojunction photodiodes on thin, flexible plastic substrate", Organic Electronics 14 (2013), pp. 2602-2609.

Arredondo, B. et al., "Performance of ITO-free inverted organic bulk heterojuction photodetectors: Comparison with standard device architecture", Organic Electronics 14 (2013), pp. 2484-2490.

Tedde, Sandro F. et al., "Fully Spray Coated Organic Photodiodes", NANO Letters, ACS Publications, 2009, vol. 9, No. 3, pp. 980-983.

International Search Report and Written Opinion for International Application No. PCT/US2016/047156, dated Oct. 28, 2016, 10 pages.

Japanese Non-Final Office Action with English Translation for Application No. 2015-047553, dated Jan. 17, 2017.

* cited by examiner

METHOD OF OPTIMIZING AN INTERFACE FOR PROCESSING OF AN ORGANIC SEMICONDUCTOR

CROSS REFERENCE TO RELATED APPLICATION

The present application relates to and claims priority of U.S. provisional patent application ("Provisional Application"), Ser. No. 62/361,341, filed on Jul. 12, 2016. The disclosure of the Provisional Application is hereby incorporated by reference in its entirety.

FIELD OF THE INVENTION

The present invention relates to image sensor circuits including organic photodiodes, and, more particularly, to optimizing the processing steps used in manufacturing these image sensor circuits.

BACKGROUND OF THE INVENTION

Organic semiconductors, including image sensor circuits, have many potential advantages over traditional amorphous silicon-based semiconductors. The chemicals used in the photodiode for the image sensor circuit can be tailored to be sensitive to different frequencies ranging from ultraviolet to infrared. The chemical films have lower stress and lower process temperatures; thus, working well with lower temperature applications, such as flexible substrates.

Manufacturing of individual organic photodiodes on a substrate to create photo sensing arrays remains a challenge. The thin film transistor ("TFT") backplane upon which the organic photodiode is deposited must be free of any organic or inorganic residue, such as residual photoresist, etch process compounds and must be very planar. This is especially important when making a photo sensitive array. If the surface is not free of any residue, then the organic chemical will not have sufficient electrical contact with the bottom electrode of the TFT backplane. This will cause non-repeatable performance from the photo sensing array from one process run to another. If the TFT backplane electrode is not planar, then the organic material may not completely cover the electrode and possible electrical shorts will result. Even if the organic material is able to cover the uneven electrode surface, performance of the organic material will be inconsistent and unrepeatable.

What is desired is an improved process of cleaning and optimizing the surface of the TFT backplane to ensure repeatable performance of an organic semiconductor.

SUMMARY OF THE INVENTION

The method of the present invention provides a consistent surface in a pixel well upon which an organic semiconductor photodiode will be manufactured, so that the interface between the pixel well and the organic photodiode can be optimized and the performance of the resultant image sensor circuit can also be optimized.

Optimizing the interface between the bottom contact of a TFT backplane and an organic semiconductor is achieved by a two-stage multistep process comprising lithographic, dry etch, chemical clean, dry etch cleaning processes. The second stage comprises several steps to clean surface contamination before beginning to manufacture an organic semiconductor.

A first method of forming an organic semiconductor according to the present invention comprises forming a thin film transistor backplane; forming a pixel well over the TFT backplane using a photoresist; performing a first plasma etch of the pixel well; stripping the photoresist in the pixel well; performing a second plasma etch of the pixel well; performing a first wash of the pixel well; exposing the pixel well to ultraviolet light; performing a second wash of the pixel well; and forming an organic photodiode in the pixel well.

A second method of forming an organic semiconductor according to the present invention comprises forming a thin film transistor backplane; forming a pixel well over the TFT backplane using a photoresist; performing a plasma etch of the pixel well; stripping the photoresist in the pixel well; performing a residue rinse of the pixel well; performing a first wash of the pixel well; exposing the pixel well to ultraviolet light; performing a second wash of the pixel well; and forming an organic photodiode in the pixel well.

The foregoing and other features, utilities and advantages of the invention will be apparent from the following more particular description of an embodiment of the invention as illustrated in the accompanying drawings.

DETAILED DESCRIPTION

During the processing steps of making the bottom contact of the TFT backplane, polymer residues can contaminate the surface of the contact metal, such as ITO, chrome, or any metal oxides having the formula $A_xB_xC_xO_x$. This can typically occur during the lithography masking step when some residual photoresist does not get completely removed before the etching step. The residual resist will form an etch block on the contact surface and result in uneven etching across the contact pad. This manifest itself in microscopic pillars on the surface of the bottom contact pad. This can cause electrical shorting or degraded diode performance of the organic photodiode.

The other form of contamination that can occur on the backplane bottom contact surface is polymer re-deposition during the dry etch process. This contamination can manifest itself as tiny particles dispersed on the sidewall of a pixel well or on the surface of the bottom contact. An example of these particles can be manifested as a plurality of raised regions or hillocks having a sub-micron feature size.

These particles can impede good or sufficient electrical contact between the organic photodiode materials and the bottom contact of the TFT backplane. This will cause electrical shorts or degraded performance of the organic diode pixel or pixels in a photo sensor array.

The method of the present invention resolves this problem by applying two methods of surface cleaning or optimization before processing the organic semiconducting materials onto the bottom contact of the TFT backplane. The first step in the optimization process is ensuring that the pixel well is properly cleared of photoresist. This can be accomplished in three ways, either by increasing the photoresist to a higher dose than nominal, such as 2.5× times the minimum dose to clear with a particular develop time. The other method is to apply a longer develop time with nominal exposure dose. The third method is to apply both, an increase exposure dose as well as longer develop time. This will allow the etch process to etch evenly across the bottom contact pad of the TFT backplane.

Figure 1:
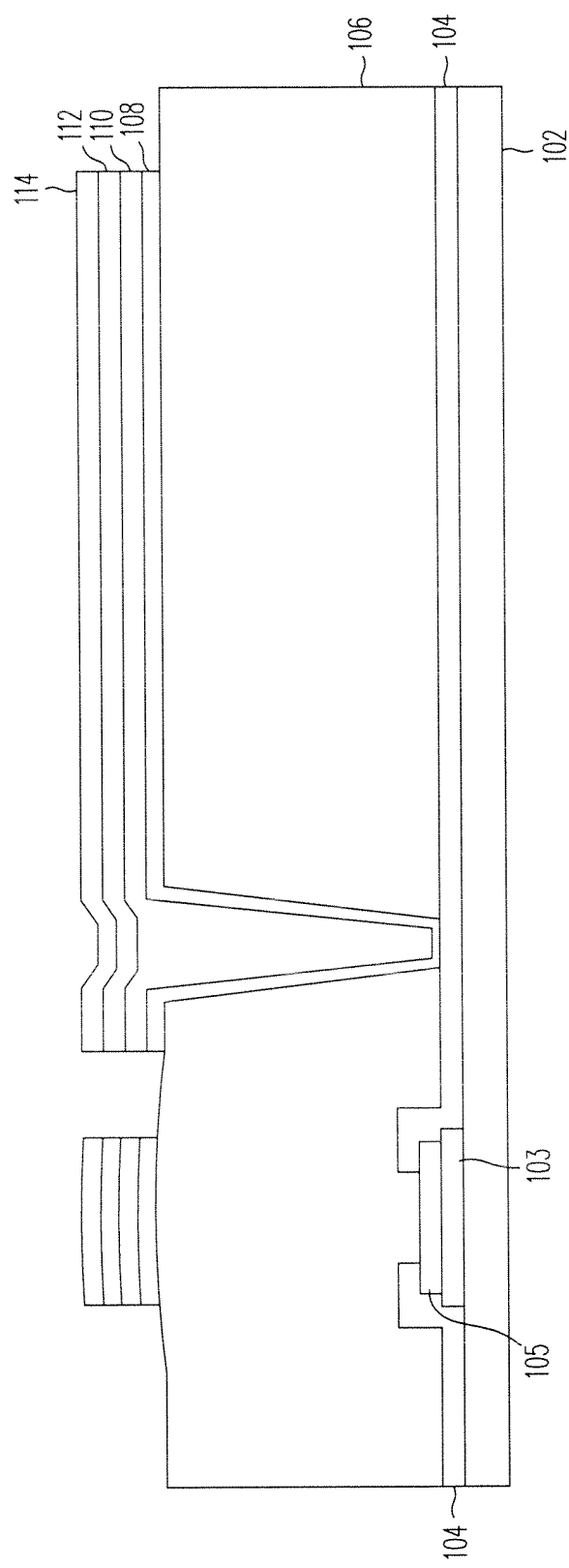
FIGS. 1-11 are cross-sectional drawings of processing steps for a manufacturing method according to present invention.

Referring now to FIG. 1, a cross-sectional view of a finished TFT backplane is shown including a glass (or other) substrate 102, metal lines 104, and a TFT including a gate 103 and an island 105. An ILD (Inter Layer Dielectric) layer 106 is also shown. A metal stack for forming a shield and for coupling metal lines 104 to the organic photodiode (not shown in FIG. 1) includes a first TiW (Titanium Tungsten) layer 108, an Al (Aluminum) layer 110, a second TiW (Titanium Tungsten) layer 112, and an ITO (Indium Tin Oxide) layer 114.

Figure 2:
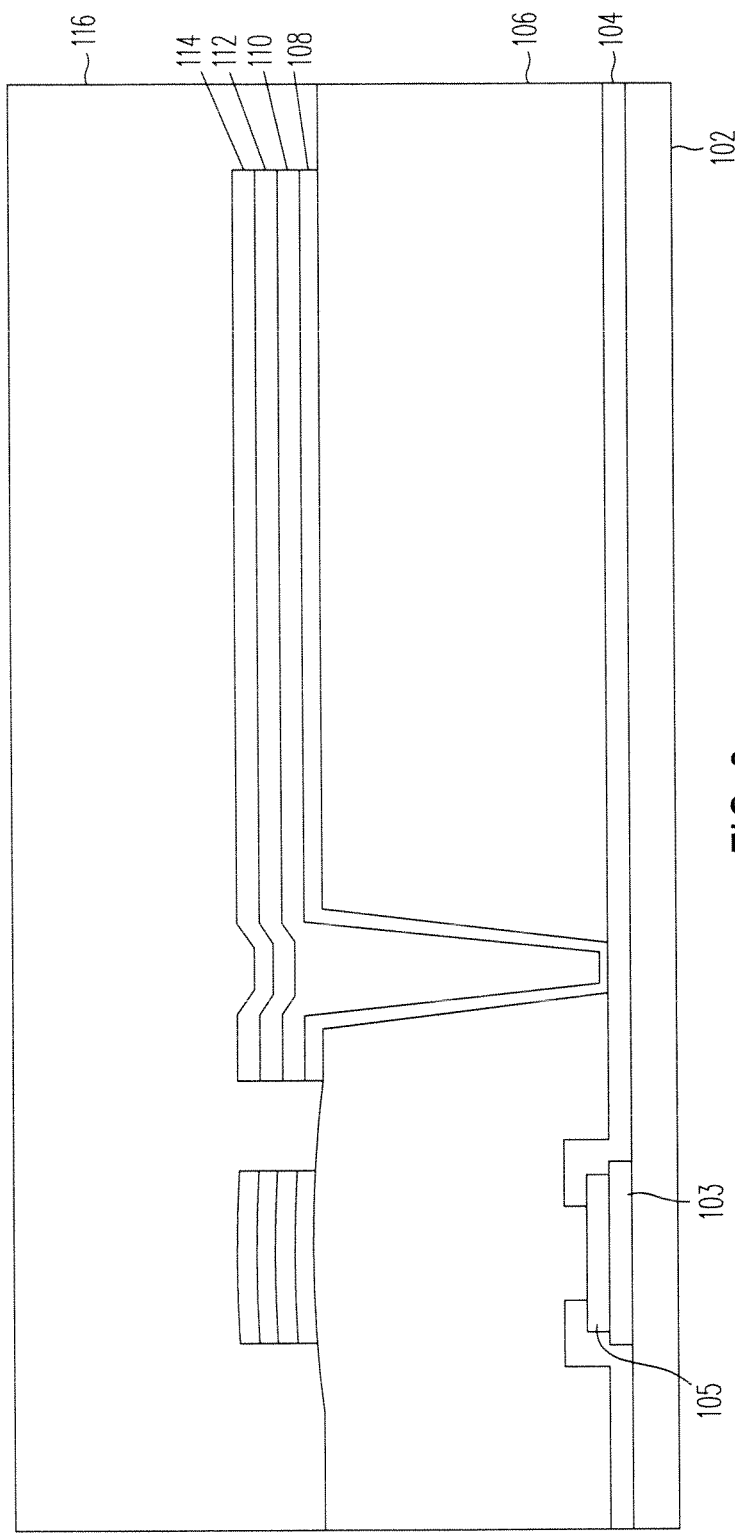

Referring now to FIG. 2, a bank layer 116 is deposited on the surface of the ILD 106 layer 106 as well using a solution process (i.e. extrusion, slot die, spin coating spray coating, or inkjet techniques). The bank layer 116 ideally has a thickness of between 1.0 and 6.0 microns. The bank layer 116 is deposited at ambient temperature followed by a soft bake (to remove solvents) at T=50° C. to 100° C. The bank layer 116 materials may include, but are not limited to, Dow Chemical Cyclotene 6100 series, or variants thereof, Honeywell PTS series, Microchem SU-8, TOK TPIR PN-0371D or other material common in the art. The bank layer 116 material provides excellent planarization (>90%) over the entire substrate.

Figure 3:
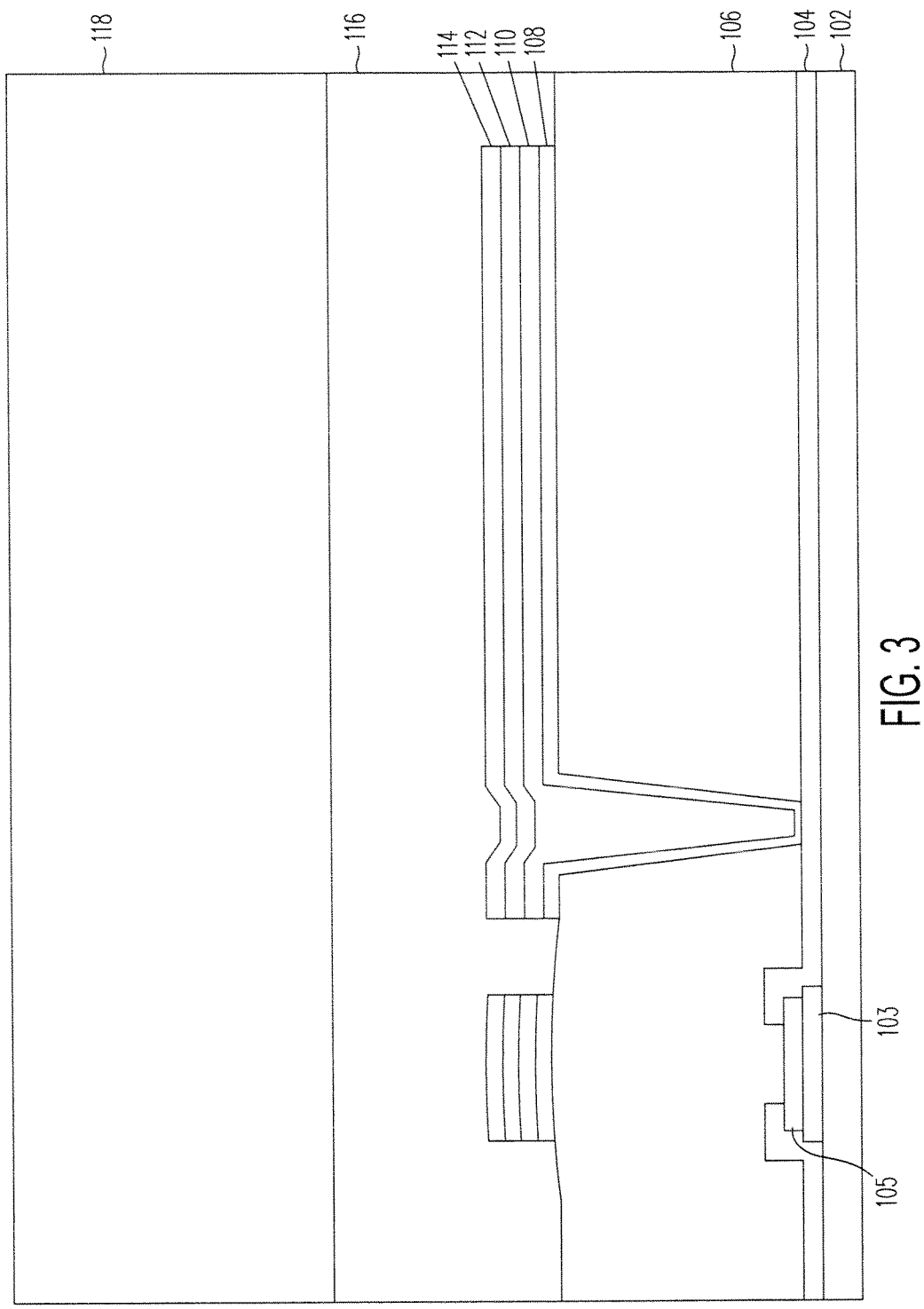

Referring now to FIG. 3, the bank layer 116 material is cured (T=200° C. to 300° C.; ideally less than 250° C.) in an $N_2$ atmosphere for 1-6 hours followed by coating with a photoresist layer 118. The photoresist layer 118 can be a positive-toned, novalac-based material. The typical thickness of the material is between 2.0 and 8.0 microns and it is deposited using an extrusion coater, or slit coater.

Figure 4:
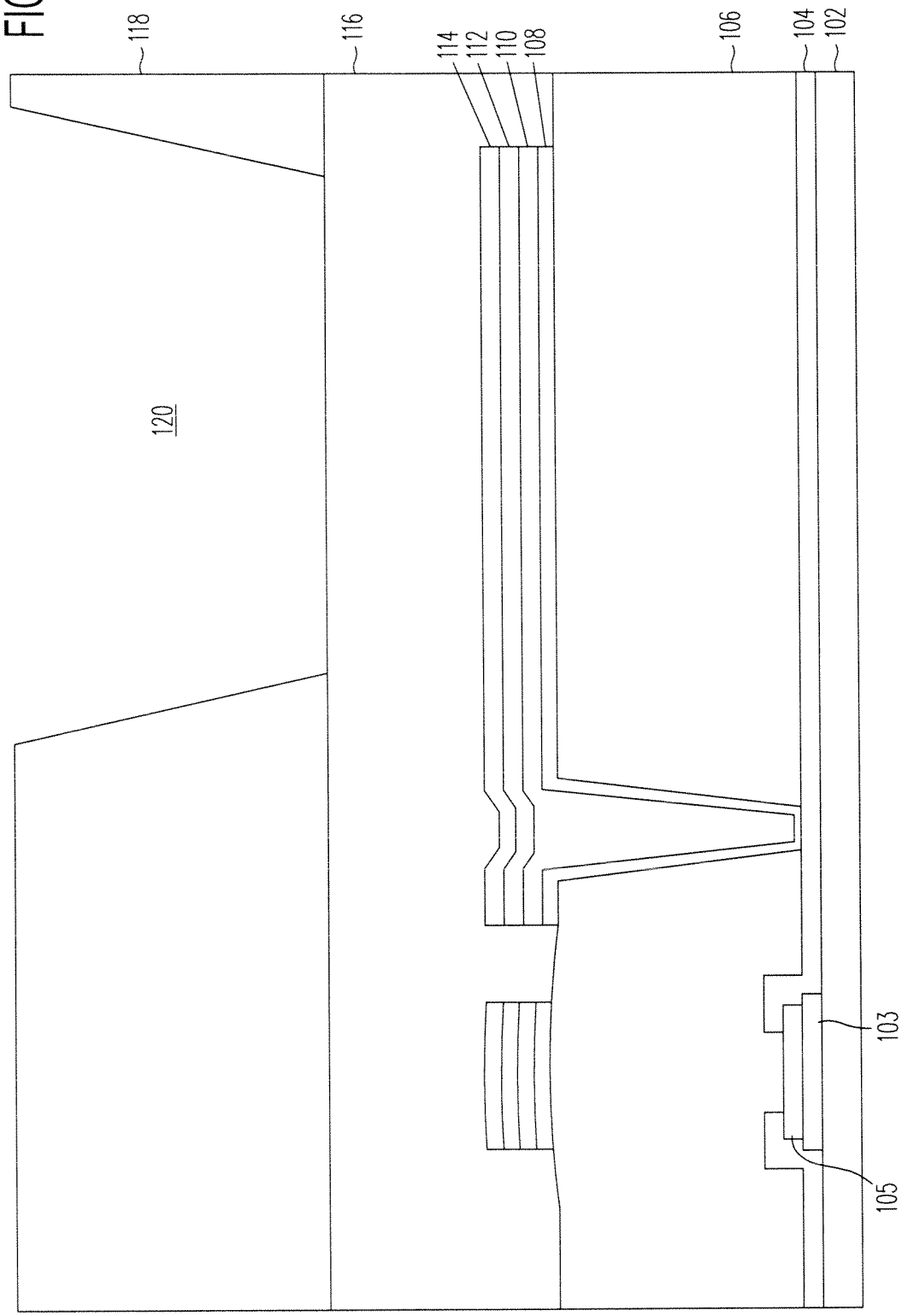

Referring now to FIG. 4, the photoresist layer 118 is exposed by i-line exposure and developed to form individual pixel wells down to the bank layer 116. An exposed portion 120 of the photoresist layer 118 that will form the pixel well is shown in FIG. 4. A typical dose range for exposing the photoresist layer 118 is 75 mJ to 200 mJ, and is ideally 90 to 125 mJ. The thickness of the photoresist layer is between one and ten microns, and ideally between two and five microns.

Figure 5:
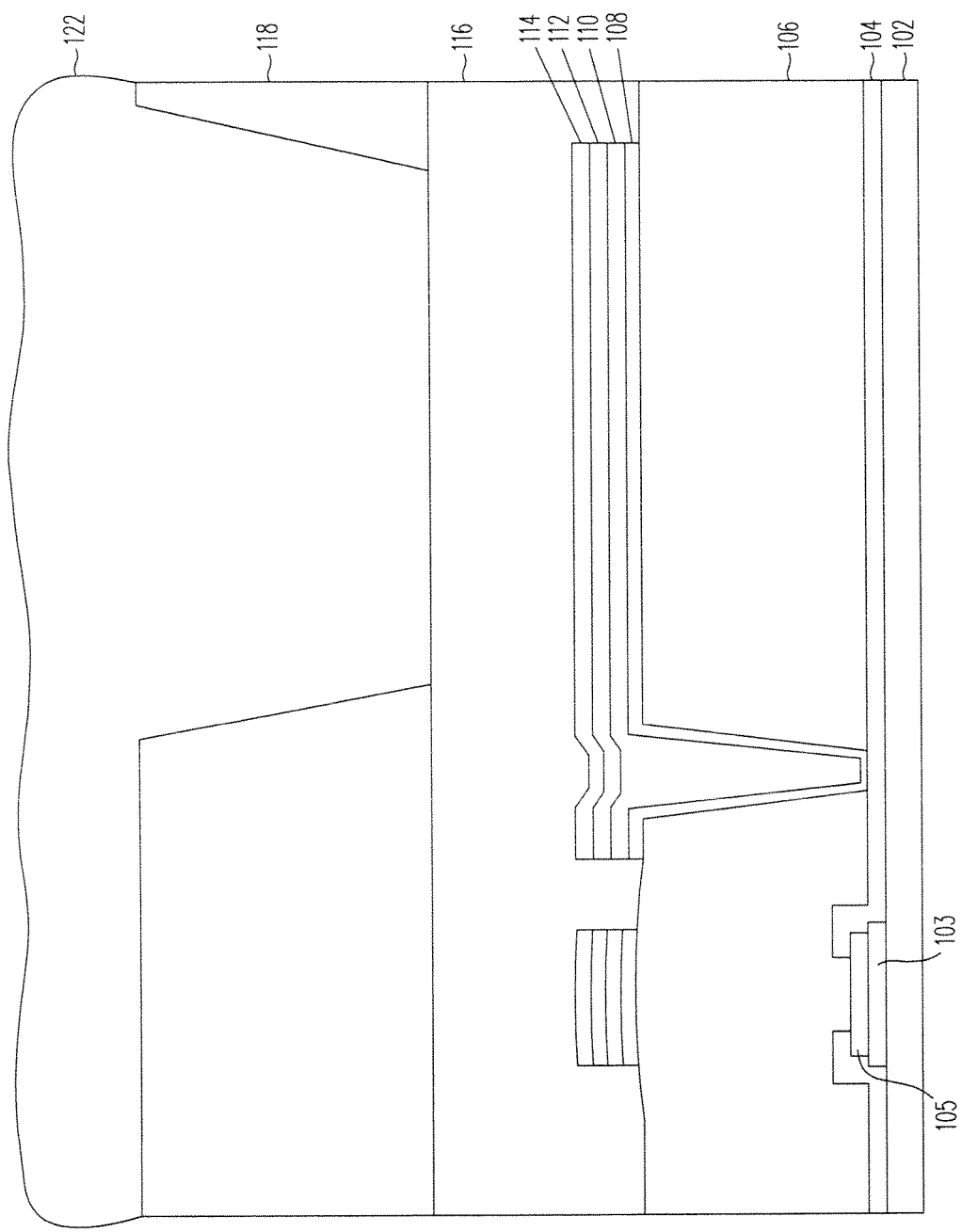

Referring now to FIG. 5, in order to minimize polymer redeposition occurrence during a dry etch step, a gas mixture of 200-1000 SCCMs of $C_xF_y$ (fluorocarbons) with 50-500 SCCMs (standard cubic centimeter per minute) of $O_2$ (Oxygen) is used. Another option according to the method of the present invention to remove any polymer redeposition is to add an additional gas mixture of 50-500 SCCMs of each chlorine ($Cl_2$) gas, Boron Chloride ($BCL_3$), and Argon gas. This dry etch step is achieved by using an RF, microwave plasma etcher with a top power between 3000 W-800 W and Bias power between 500 W-2500 Watts. The plasma used in the dry etch step is shown as layer 122 in FIG. 5.

Figure 6:
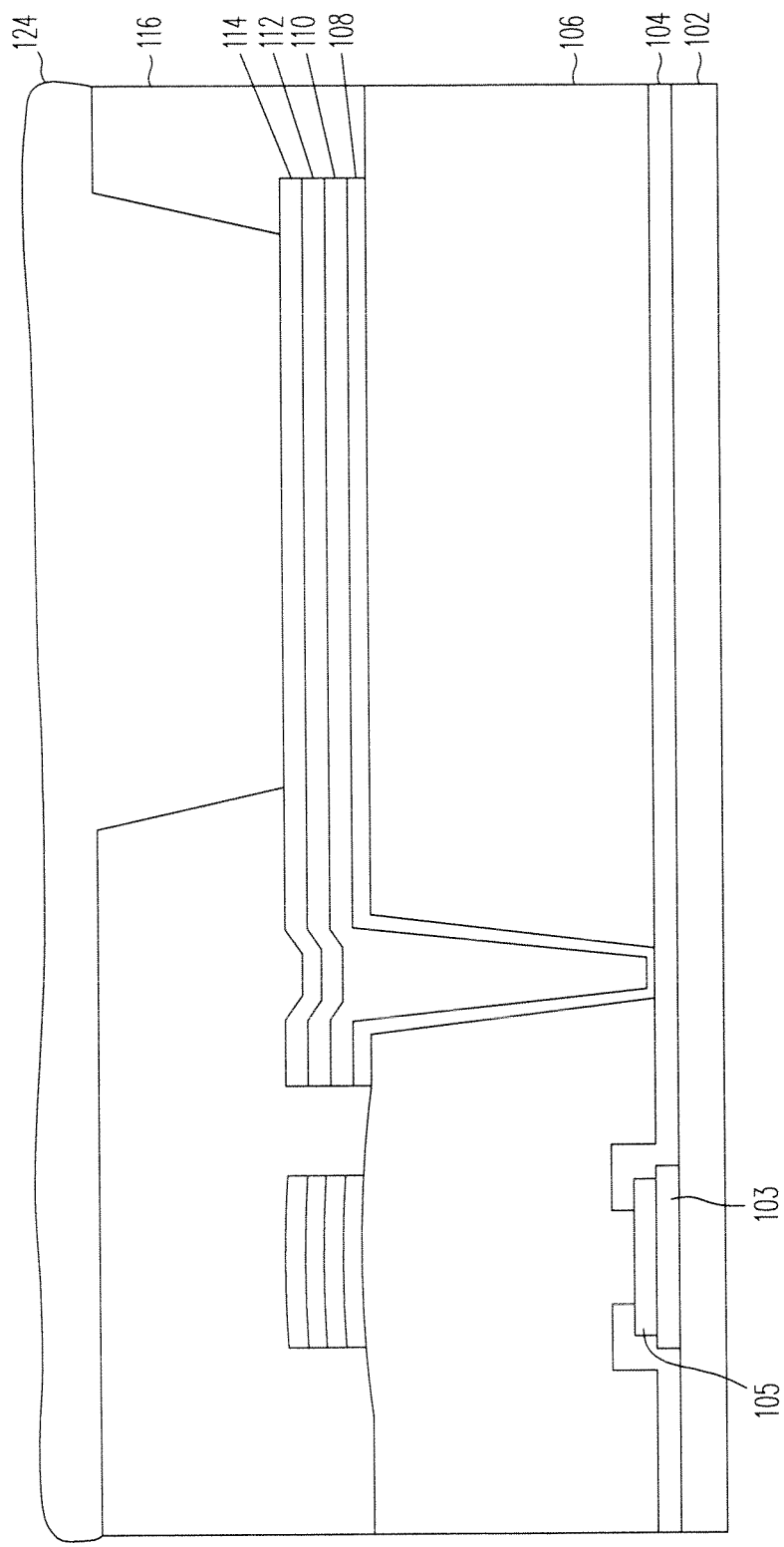

Referring to FIG. 6, the third step of the process according to the present invention is to process the TFT backplane through an organic film remover, shown as layer 124. The organic film remover is typically an NMP-based material (N-Methyl-2-Pyrrolidone). The wash is usually performed at 60° C. for five minutes followed by a de-ionized water rinse. The bank layer 116 material is immune to the strip chemistry and remains as part of the device. Following the strip process, the individual pixel wells are formed to create the organic photodiode layer in the process (not shown in FIG. 6). It is important to note that the bank layer 116 material is highly planar, thus providing excellent dielectric separation between the metal layer features. The bank layer 116 can be rinsed multiple times to ensure complete removal of any photoresist polymer.

Figure 7:
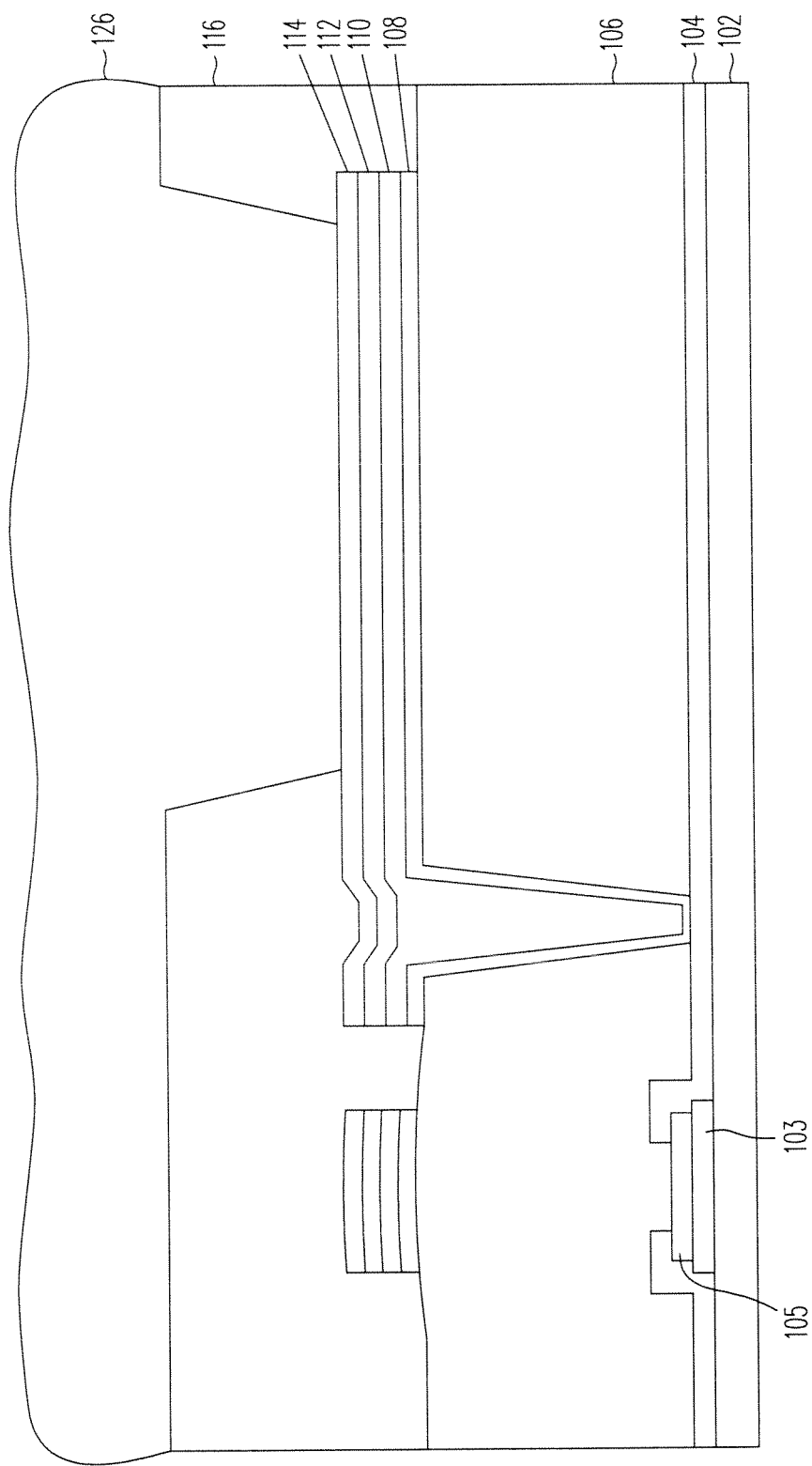

Referring now to FIG. 7, the fourth step of optimizing the TFT backplane bottom contact surface according to the method of the present invention is to process the plates through a dry etch cleaning step. The first option is to use a gas mixture of 200-1000 SCCMs of $C_xF_y$ with 50-500 SCCMs of $O_2$ and 50-500 SCCMs of each chlorine ($Cl_2$) gas. Boron Chloride ($BCL_3$), and Argon gas. The top power of the RF plasma dry etcher is between 3000 W-8000 W and the bias power is between 500 W-2500 W. The plasma used in the dry etch step is shown as layer 126 in FIG. 7.

Figure 8:
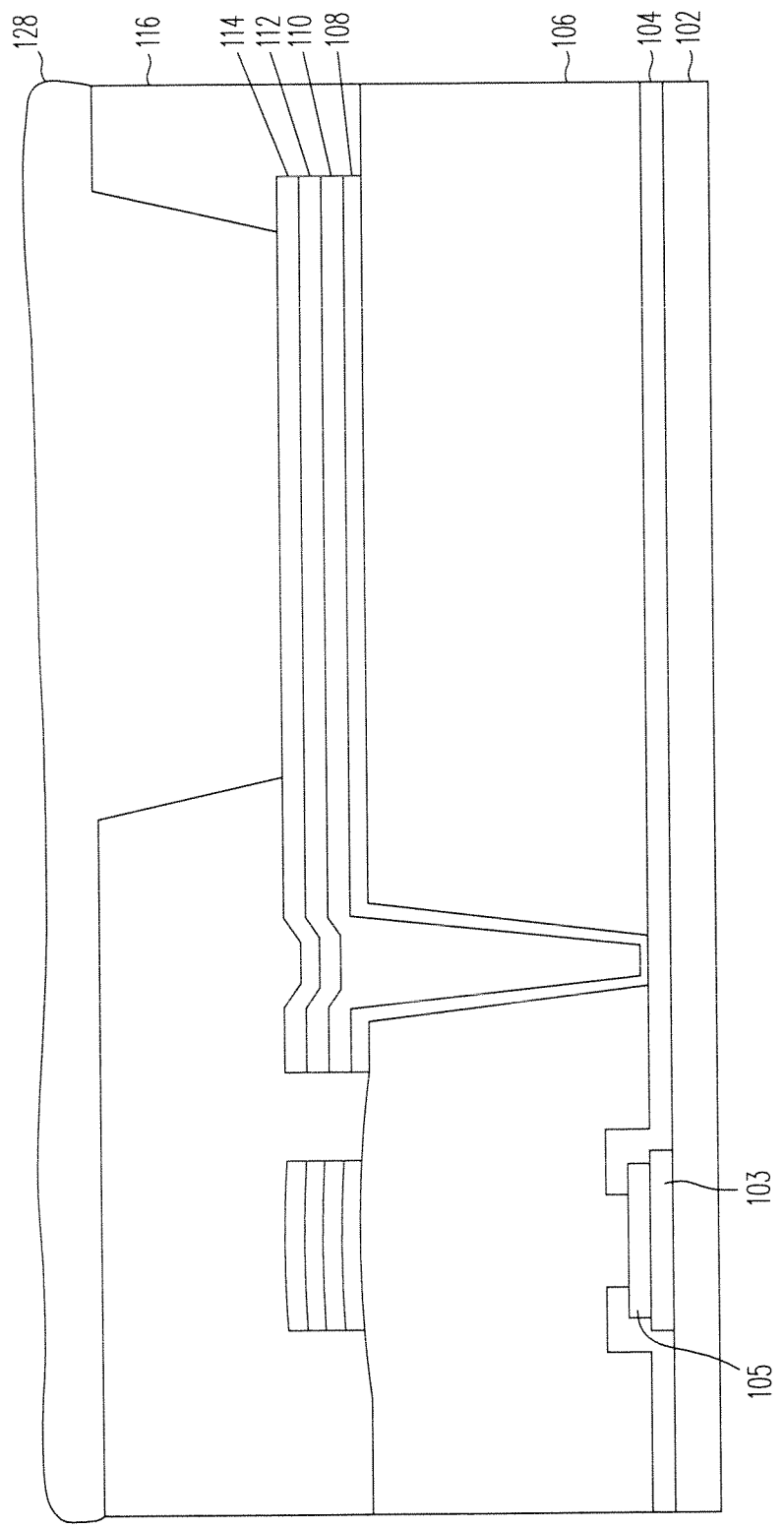

Referring now to FIG. 8, the fifth step according to the method of the present invention is to wash the plates in de-ionized water followed by a drying step. The water rinse is shown as layer 128 in FIG. 8

Figure 9:
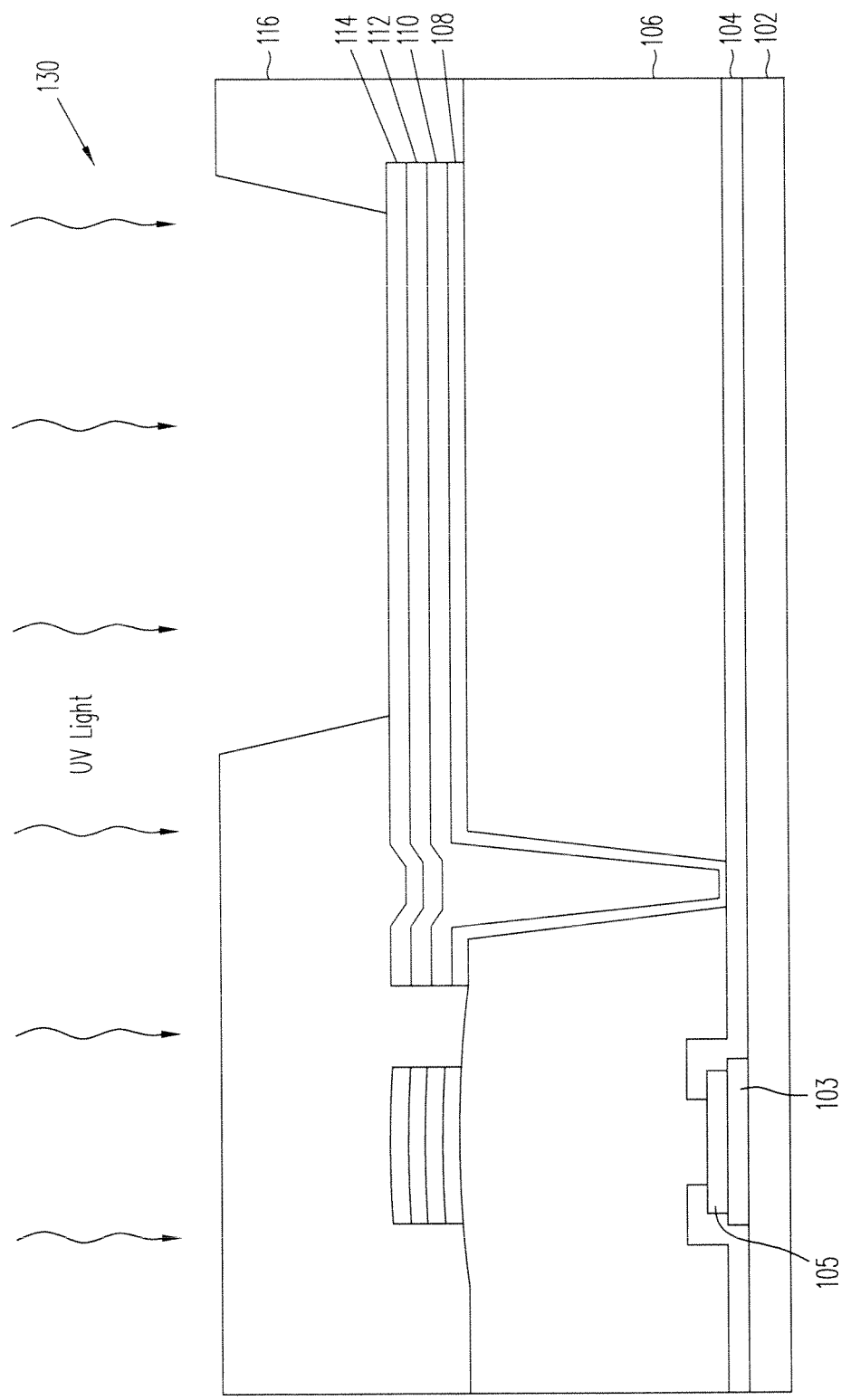

Referring now to FIG. 9, the sixth step according to the method of the present invention is to expose the array to UV light 130 between 30-300 seconds to remove any microscopic organic contamination buildup from packaging or handling.

Figure 10:
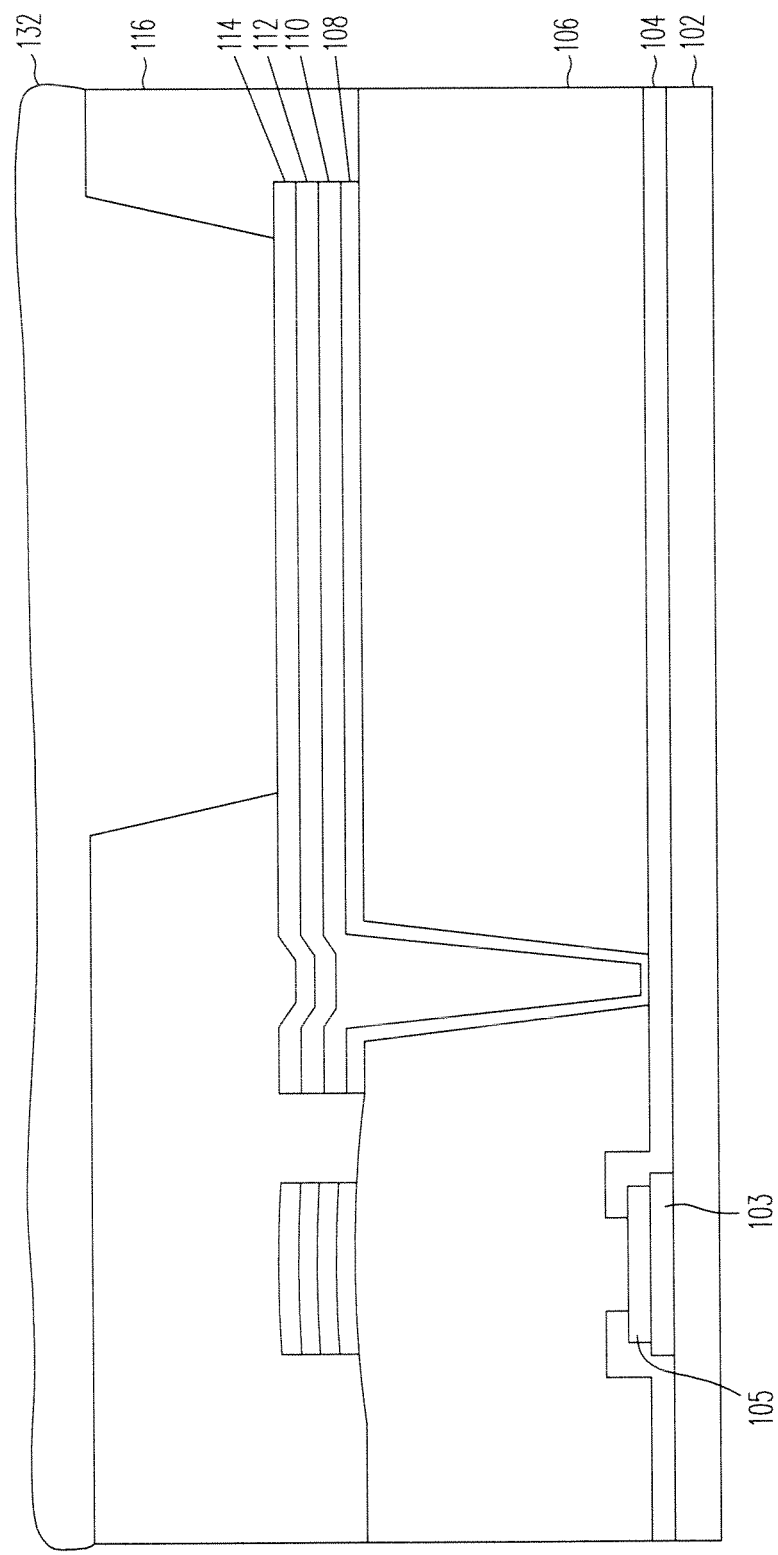

Referring now to FIG. 10, the seventh, and last, step according to the method of the present invention is to wash the TFT backplane with water followed by a drying step. This is performed just before manufacturing the organic photo sensor array. The water rinse is shown as layer 132 in FIG. 10.

Figure 11:
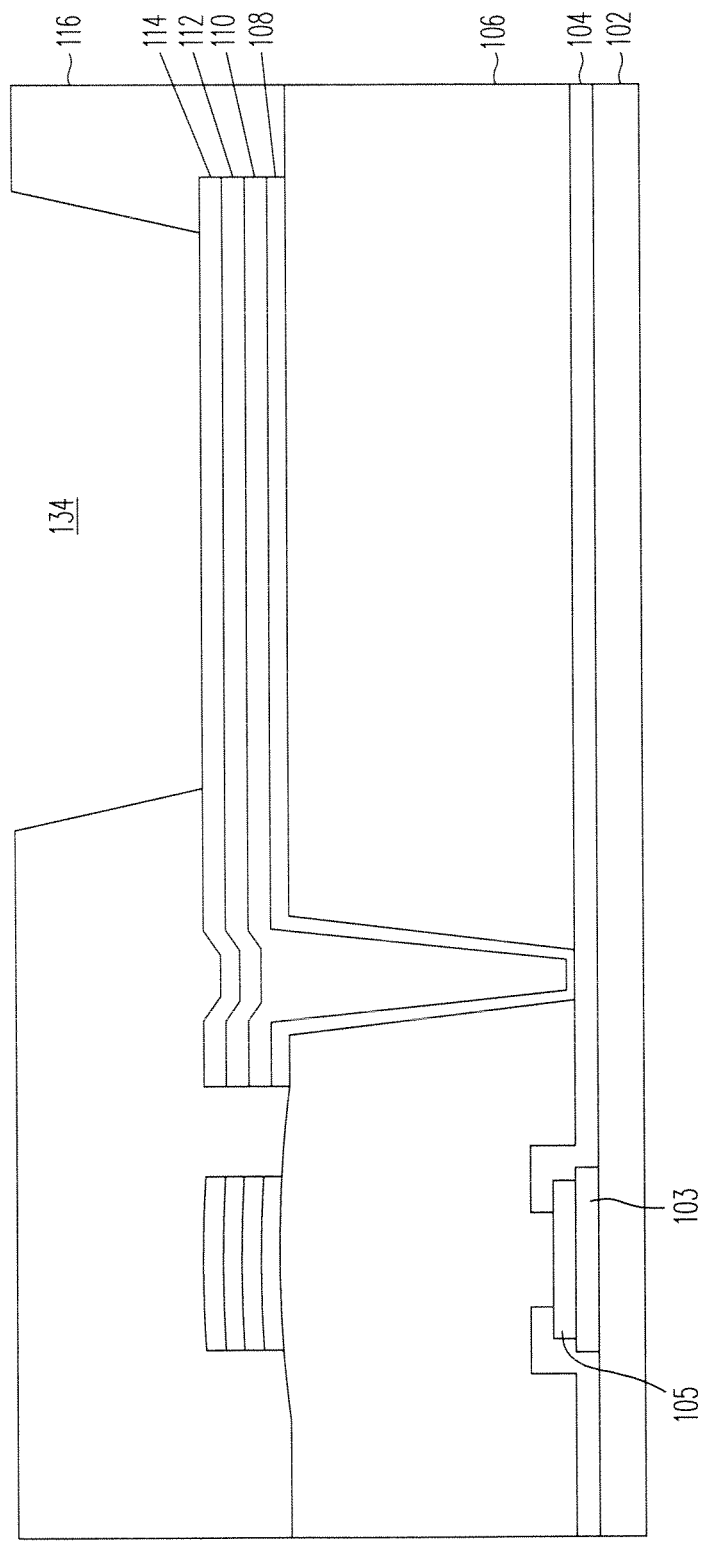

Referring now to FIG. 11, the completed pixel cell substantially free of contamination is shown except for forming the organic photodiode, which is placed into pixel well 134. An appropriate organic photodiode structure can be found is co-pending patent applications US 2017/0054097, US 2017/0084665, Ser. No. 15/344,335, Ser. No. 15/369,455, and Ser. No. 15/381,679, which are all incorporated herein in their entirety.

Figure 12:
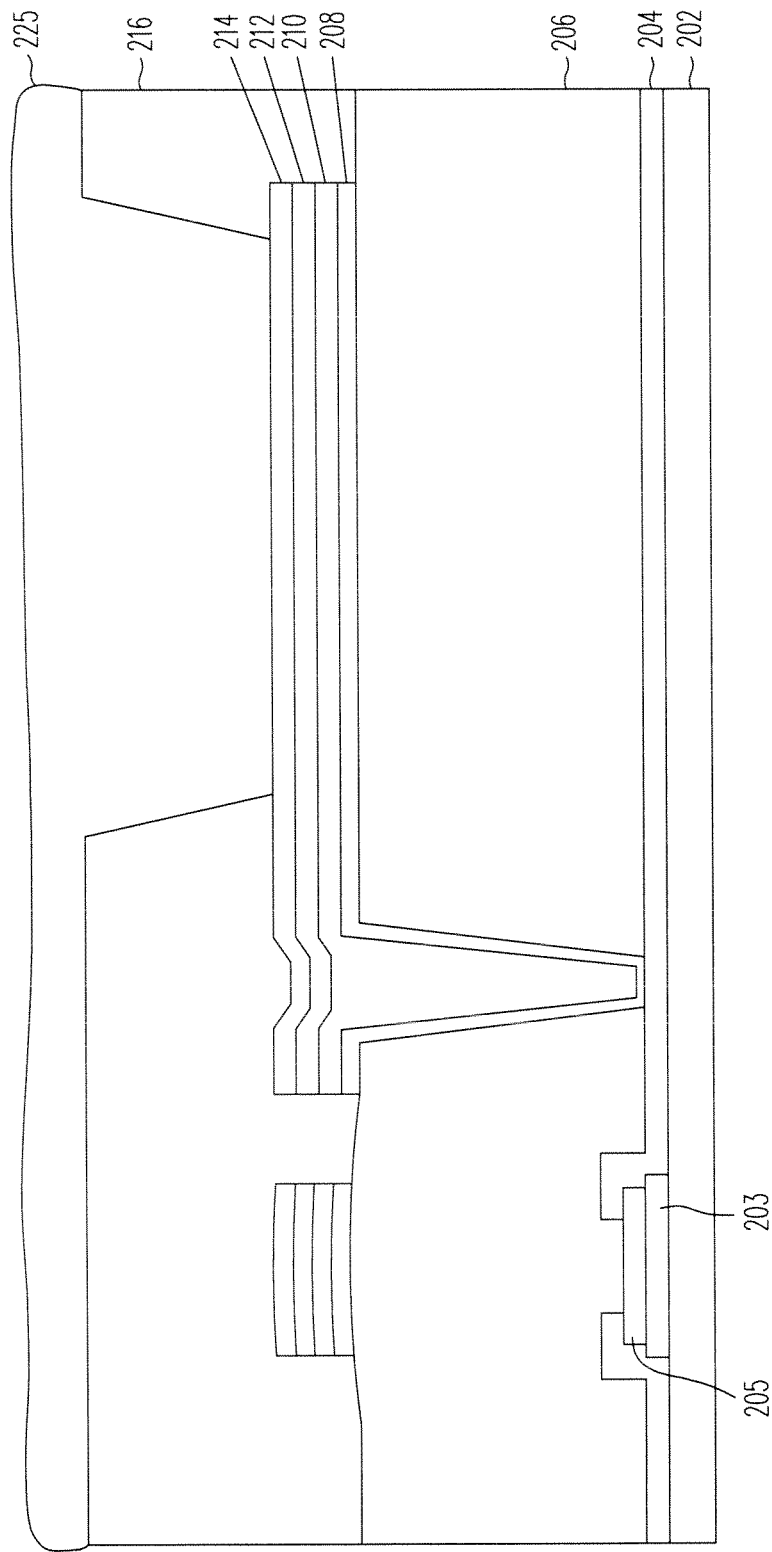
FIG. 12 is a cross-sectional drawing of a substitute processing step that can be used in the manufacturing method according to the present invention.

Referring now to FIG. 12, a cross-sectional drawing of a substitute processing step that can be used in the manufacturing method according to the present invention is shown. Specifically, FIG. 12 can be substituted for FIG. 7 in the sequence of steps shown in FIGS. 1-11, previously discussed. A second method of optimizing the bottom contact of a TFT backplane before manufacturing an organic photo sensor array according to the present invention is to complete the steps described with respect to FIGS. 1-6 above, but instead of applying a dry etch cleaning step, a polymer residue removal step is performed as is shown in FIG. 7. This is a wet etch step that rinses the array between 60 and 300 seconds at room temperature. The chemical used comprises primarily ammonium fluoride, hydrofluoric acid and ethylene glycol. Afterwards, the remaining steps associated with FIGS. 8-12 are completed to finish the process.

The identification numerals are changed slightly in FIG. 12 to show a glass or other substrate 202, island 203, metal lines 204, island 205, ILD layer 206, metal stack 208, 210, 212, 214, bank layer 216, and polymer residue rinse 225. All of the layers except for the polymer residue rinse were described previously.

While the invention has been particularly shown and described with reference to a preferred embodiment thereof, it will be understood by those skilled in the art that various other changes in the form and details may be made without departing from the spirit and scope of the invention.

We claim:

1. A method of forming an organic semiconductor comprising:

forming a thin film transistor ("TFT") backplane;
forming a pixel well over the TFT backplane using a photoresist;
performing a first plasma etch of the pixel well;
stripping the photoresist in the pixel well;
performing a second plasma etch of the pixel well;
performing a first wash of the pixel well;
exposing the pixel well to ultraviolet light;
performing a second wash of the pixel well; and
forming an organic photodiode in the pixel well.

2. The method of claim 1, wherein the first plasma etch is performed using a gas comprising a fluorocarbon compound and oxygen.

3. The method of claim 2, wherein the first plasma etch is performed using a gas further comprising chlorine, boron chloride, and argon gas.

4. The method of claim 1, wherein stripping the photoresist comprises applying a photoresist stripping material.

5. The method of claim 1, wherein the second plasma etch is performed using a gas comprising a fluorocarbon compound and oxygen.

6. The method of claim 5, wherein the second plasma etch is performed using gas further comprising chlorine, boron chloride, and argon gas.

7. The method of claim 1, wherein the first wash is followed by a drying step.

8. The method of claim 1, wherein the pixel well is exposed to ultraviolet light between 30 and 300 seconds.

9. The method of claim 1, wherein the second wash is followed by a drying step.

10. The method of claim 1, further comprising forming a bank layer between the TFT backplane and the pixel well.

11. A method of forming an organic semiconductor comprising:
forming a thin film transistor ("TFT") backplane;
forming a pixel well over the TFT backplane using a photoresist;
performing a plasma etch of the pixel well;
stripping the photoresist in the pixel well;
performing a residue rinse of the pixel well;
performing a first wash of the pixel well;
exposing the pixel well to ultraviolet light;
performing a second wash of the pixel well; and
forming an organic photodiode in the pixel well.

12. The method of claim 11, wherein the plasma etch is performed using a gas comprising a fluorocarbon compound and oxygen.

13. The method of claim 12, wherein the first plasma etch is performed using a gas further comprising chlorine, boron chloride, and argon gas.

14. The method of claim 11, wherein stripping the photoresist comprises applying a photoresist stripping material.

15. The method of claim 11, wherein the residue rinse is performed using a rinse material comprising ammonium fluoride, hydrofluoric acid, and ethylene glycol.

16. The method of claim 11, wherein the residue rinse is performed between 60 and 300 seconds at room temperature.

17. The method of claim 11, wherein the first wash is followed by a drying step.

18. The method of claim 11, wherein the pixel well is exposed to ultraviolet light between 30 and 300 seconds.

19. The method of claim 11, wherein the second wash is followed by a drying step.

20. The method of claim 11, further comprising forming a bank layer between the TFT backplane and the pixel well.

* * * * *